(12) United States Patent
Kyogoku et al.

(10) Patent No.: US 10,236,339 B2
(45) Date of Patent: Mar. 19, 2019

(54) SEMICONDUCTOR DEVICE

(71) Applicant: Kabushiki Kaisha Toshiba, Minato-ku (JP)

(72) Inventors: Shinya Kyogoku, Tsukuba (JP); Ryosuke Iijima, Setagaya (JP); Keiko Ariyoshi, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/692,798

(22) Filed: Aug. 31, 2017

(65) Prior Publication Data

US 2018/0083094 A1 Mar. 22, 2018

(30) Foreign Application Priority Data

Sep. 21, 2016 (JP) .................. 2016-183918

(51) Int. Cl.
*H01L 29/06* (2006.01)
*H01L 29/36* (2006.01)
(Continued)

(52) U.S. Cl.
CPC ............. *H01L 29/06* (2013.01); *H01L 21/22* (2013.01); *H01L 21/38* (2013.01); *H01L 23/482* (2013.01);
(Continued)

(58) Field of Classification Search
CPC ... H02L 29/06; H02L 29/36; H02L 29/42364; H02L 29/42372; H02L 23/4825; H02L 23/4827; H02L 23/485; H02L 23/53295
See application file for complete search history.

(56) References Cited

U.S. PATENT DOCUMENTS 5,396,085 A 3/1995 Baliga
5,885,878 A * 3/1999 Fujishima ........... H01L 29/0634
148/DIG. 126
(Continued)

FOREIGN PATENT DOCUMENTS

JP 2003-318409 11/2003
JP 2012-169384 9/2012
(Continued)

OTHER PUBLICATIONS

Rina Tanaka, et al. "Impact of Grounding the Bottom Oxide Protection Layer on the Short-Circuit Ruggedness of 4H—SiC Trench MOSFETs", Proceeding of the 26th International Symposium on Power Semiconductor Devices & ICs, 2014, 4 pages.

*Primary Examiner* — Ida M Soward
(74) *Attorney, Agent, or Firm* — Oblon, McClelland, Maier & Neustadt, L.L.P.

(57) ABSTRACT

According to one embodiment, a semiconductor device includes first to sixth semiconductor regions, a first electrode, and a first insulating film. The first semiconductor region includes first and second partial regions. The second semiconductor region is separated from the first partial region in a second direction crossing a first direction. The third semiconductor region is provided between the first partial region and the second semiconductor region. The fourth semiconductor region is provided between the first partial region and the third semiconductor region. The first electrode is separated from the second partial region, the second and third semiconductor regions, and a portion of the fourth semiconductor region. The first insulating film contacts the third semiconductor region. The fifth semiconductor region is provided between the first insulating film and the second partial region. The sixth semiconductor region is
(Continued)

provided between the first insulating film and the fifth semiconductor region.

19 Claims, 8 Drawing Sheets

(51) Int. Cl.
| | |
|---|---|
| H01L 23/48 | (2006.01) |
| H01L 21/22 | (2006.01) |
| H01L 21/38 | (2006.01) |
| H01L 23/482 | (2006.01) |
| H01L 23/485 | (2006.01) |
| H01L 23/532 | (2006.01) |
| H01L 29/423 | (2006.01) |
| H01L 29/739 | (2006.01) |

(52) U.S. Cl.
CPC ........ *H01L 23/485* (2013.01); *H01L 23/4825* (2013.01); *H01L 23/4827* (2013.01); *H01L 23/53295* (2013.01); *H01L 29/36* (2013.01); *H01L 29/42364* (2013.01); *H01L 29/42372* (2013.01); *H01L 29/7393* (2013.01)

(56) References Cited

U.S. PATENT DOCUMENTS

| | | | |
|---|---|---|---|
| 6,518,623 B1 * | 2/2003 | Oda | H01L 29/66553 257/330 |
| 6,756,612 B1 * | 6/2004 | Nemati | H01L 27/0817 257/133 |
| 7,368,783 B2 * | 5/2008 | Mizukami | H01L 29/0623 257/330 |
| 7,723,784 B2 * | 5/2010 | Miyahara | H01L 29/0878 257/328 |
| 7,897,440 B1 * | 3/2011 | Horch | G11C 11/39 257/107 |
| 7,947,555 B2 * | 5/2011 | Akiba | H01L 29/0623 257/218 |
| 9,647,108 B2 * | 5/2017 | Suzuki | H01L 29/66068 |
| 9,825,166 B2 * | 11/2017 | Tega | H01L 29/7813 |
| 2009/0261350 A1 * | 10/2009 | Yamamoto | H01L 29/0623 257/77 |
| 2013/0062690 A1 * | 3/2013 | Yoshimochi | H01L 29/41766 257/334 |
| 2014/0175459 A1 | 6/2014 | Yamamoto et al. | |
| 2015/0053999 A1 | 2/2015 | Kumagai | |
| 2015/0129895 A1 * | 5/2015 | Takeuchi | H01L 29/4236 257/77 |
| 2016/0204227 A1 * | 7/2016 | Su | H01L 29/7813 438/212 |
| 2016/0247910 A1 | 8/2016 | Suzuki et al. | |
| 2016/0336391 A1 * | 11/2016 | Tanaka | H01L 29/78 |
| 2017/0133466 A1 * | 5/2017 | Shiomi | H01L 29/1095 |
| 2018/0277371 A1 * | 9/2018 | Nakano | H01L 29/8611 |

FOREIGN PATENT DOCUMENTS

| | | |
|---|---|---|
| JP | 2012-191056 | 10/2012 |
| JP | 2015-41719 | 3/2015 |
| JP | 2015-72999 | 4/2015 |

* cited by examiner

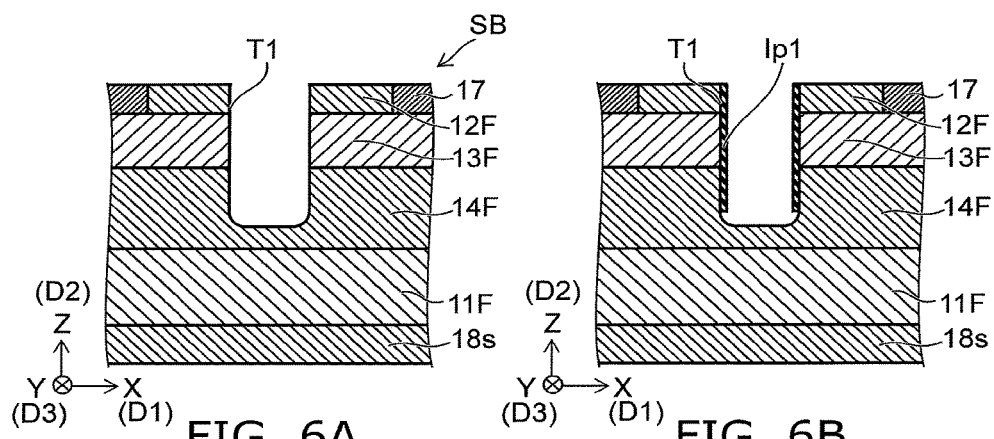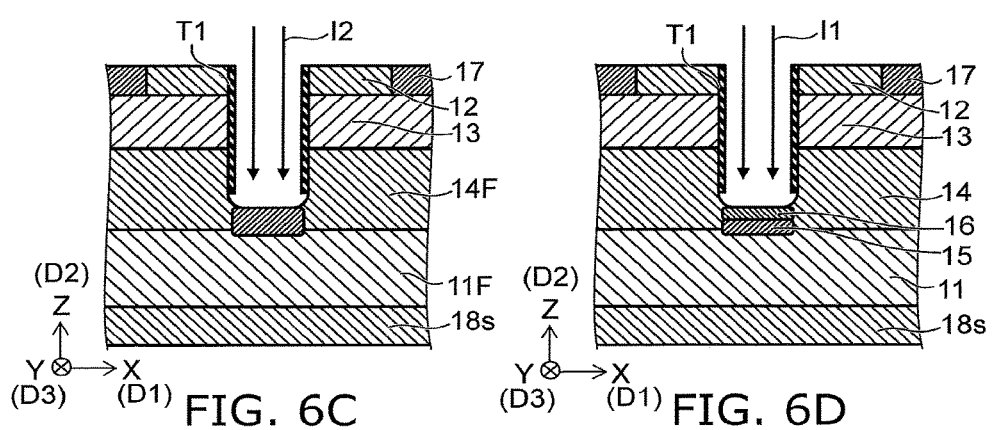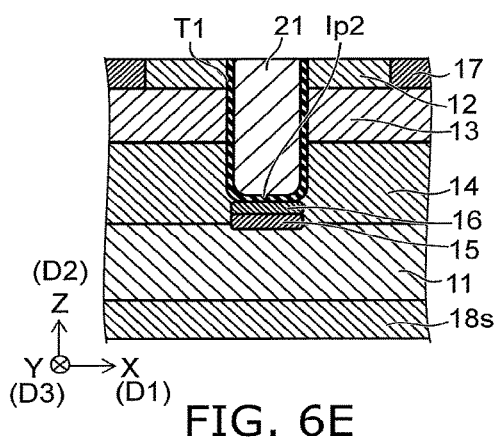

SEMICONDUCTOR DEVICE

CROSS-REFERENCE TO RELATED APPLICATIONS

This application is based upon and claims the benefit of priority from Japanese Patent Application No. 2016-183918, filed on Sep. 21, 2016; the entire contents of which are incorporated herein by reference.

FIELD

Embodiments described herein relate generally to a semiconductor device and a method for manufacturing the same.

BACKGROUND

It is desirable to increase the reliability of a semiconductor device.

BRIEF DESCRIPTION OF THE DRAWINGS

FIG. 6A to FIG. 6E are schematic cross-sectional views in order of the processes, illustrating a method for manufacturing the semiconductor device according to the embodiment;

DETAILED DESCRIPTION

Figure 1A:
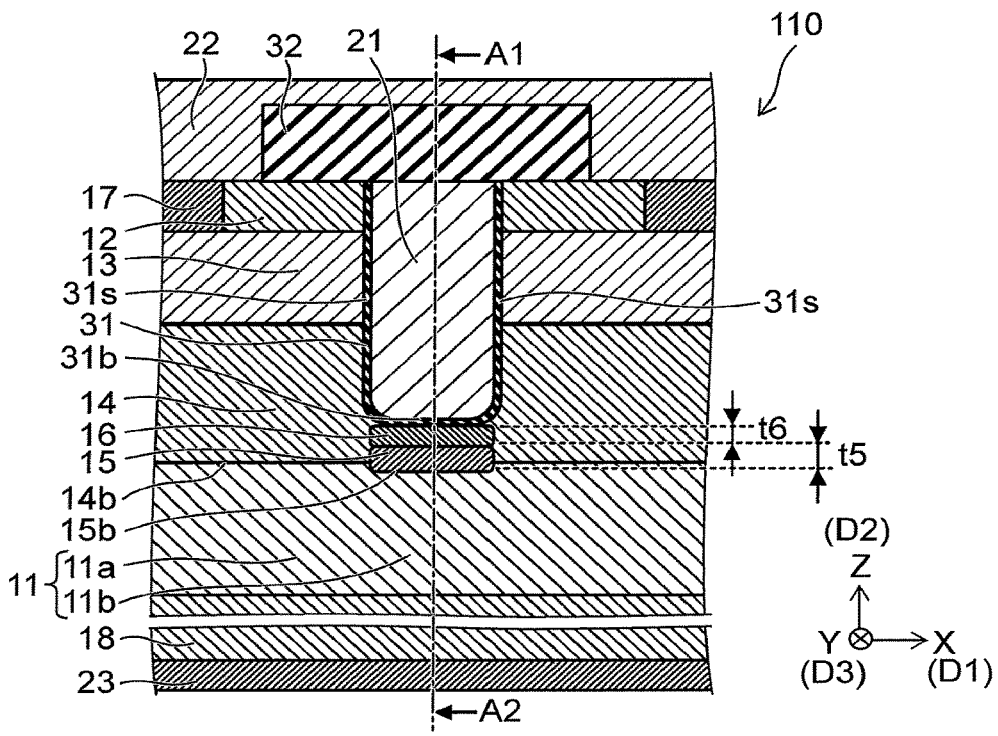
FIG. 1A and FIG. 1B are schematic views illustrating a semiconductor device according to a first embodiment.

According to one embodiment, a semiconductor device includes first to sixth semiconductor regions, a first electrode, and a first insulating film. The first semiconductor region includes a first partial region and a second partial region and is of a first conductivity type. The second semiconductor region is separated from the first partial region in a second direction crossing a first direction. The second semiconductor region is of the first conductivity type. The first direction is from the first partial region toward the second partial region. The third semiconductor region is provided between the first partial region and the second semiconductor region. The third semiconductor region is of a second conductivity type. The fourth semiconductor region is provided between the first partial region and the third semiconductor region. The fourth semiconductor region is of the first conductivity type. The first electrode is separated from the second partial region in the second direction and separated from the second semiconductor region, the third semiconductor region, and a portion of the fourth semiconductor region in the first direction. The first insulating film contacts the third semiconductor region and is provided between the second partial region and the first electrode in the second direction, between the second semiconductor region and the first electrode in the first direction, between the third semiconductor region and the first electrode in the first direction, and between the first electrode and the portion of the fourth semiconductor region in the first direction. The fifth semiconductor region is provided between the first insulating film and the second partial region in the second direction. The fifth semiconductor region is of the second conductivity type. The sixth semiconductor region is provided between the first insulating film and the fifth semiconductor region in the second direction. The sixth semiconductor region is of the first conductivity type. A first impurity concentration of the first conductivity type in the sixth semiconductor region is higher than a second impurity concentration of the first conductivity type in the fourth semiconductor region.

According to another embodiment, a method for manufacturing a semiconductor device is disclosed. The method can include forming a trench in a stacked body. The stacked body includes a first semiconductor film of a first conductivity type provided on a substrate, a fourth semiconductor film of the first conductivity type provided on the first semiconductor film, a third semiconductor film of a second conductivity type provided on the fourth semiconductor film, and a second semiconductor film of the first conductivity type provided on the third semiconductor film. The trench reaches a portion of the fourth semiconductor film from the second semiconductor film. The method can include forming a first insulating portion at a side wall of the trench. At least a portion of a bottom portion of the trench is not covered with the first insulating portion. The method can include introducing an impurity of the second conductivity type into the at least a portion of the bottom portion of the trench. The method can include introducing an impurity of the first conductivity type into an upper portion of a portion of the at least a portion of the bottom portion of the trench where the impurity of the second conductivity type is introduced. A concentration of the impurity of the first conductivity type in the upper portion where the impurity of the first conductivity type is introduced is higher than a concentration of the impurity of the second conductivity type in the upper portion where the impurity of the first conductivity type is introduced. The method can include forming a second insulating portion on the upper portion where the impurity of the first conductivity type is introduced. In addition, the method can include forming a first electrode by introducing a conductive material into a remaining space of the trench on the second insulating portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
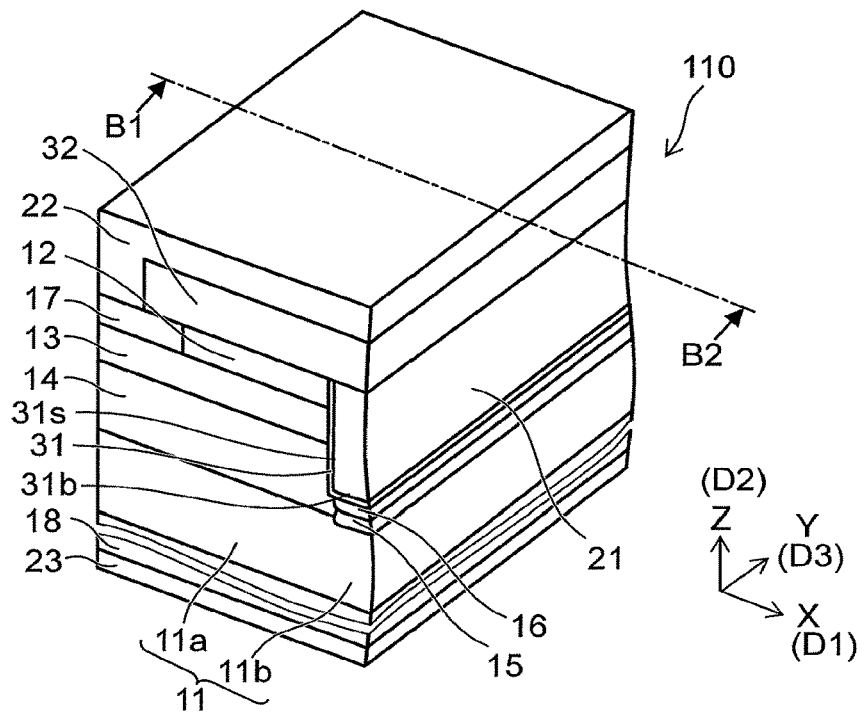

FIG. 1A and FIG. 1B are schematic views illustrating a semiconductor device according to a first embodiment.

FIG. 1A is a cross-sectional view corresponding to a cross section along line B1-B2 shown in FIG. 1B. FIG. 1B is a perspective view when cut along line A1-A2 of FIG. 1A.

As shown in FIG. 1A and FIG. 1B, the semiconductor device 110 according to the embodiment includes first to sixth semiconductor regions 11 to 16, a first electrode 21, and a first insulating film 31.

The first semiconductor region 11 includes a first partial region 11a and a second partial region 11b. The first semiconductor region 11 is of a first conductivity type.

A first direction D1 from the first partial region 11a toward the second partial region 11b is taken as an X-axis direction.

One direction perpendicular to the X-axis direction is taken as a Y-axis direction. A direction perpendicular to the X-axis direction and the Y-axis direction is taken as a Z-axis direction.

The second semiconductor region 12 is separated from the first partial region 11a in a second direction D2. The second direction D2 crosses the first direction D1. The second direction D2 may be perpendicular to the first direction D1 or may be tilted with respect to the first direction D1. Hereinbelow, the second direction D2 is taken as the Z-axis direction. The second semiconductor region 12 is of the first conductivity type.

The third semiconductor region 13 is provided between the first partial region 11a and the second semiconductor region 12. The third semiconductor region 13 is of a second conductivity type.

For example, the first conductivity type is an n-type; and the second conductivity type is a p-type. In the embodiment, the first conductivity type may be the p-type; and the second conductivity type may be the n-type. In the description hereinbelow, the first conductivity type is taken to be the n-type; and the second conductivity type is taken to be the p-type.

The fourth semiconductor region 14 is provided between the first partial region 11a and the third semiconductor region 13. The fourth semiconductor region 14 is of the first conductivity type (e.g., the n-type).

The first electrode 21 is separated from the second partial region 11b in the second direction D2. The first electrode 21 is separated from the second semiconductor region 12 in the first direction D1. The first electrode 21 is separated from the third semiconductor region 13 in the first direction D1. The first electrode 21 is separated from a portion of the fourth semiconductor region 14 in the first direction D1.

The second semiconductor region 12, the third semiconductor region 13, and the fourth semiconductor region 14 are stacked along the second direction D2. The second direction D2 is the stacking direction.

For example, the first electrode 21 extends along the second direction D2 (the stacking direction) through the second semiconductor region 12, the third semiconductor region 13, and a portion of the fourth semiconductor region 14.

For example, the stacking direction of the second semiconductor region 12, the third semiconductor region 13, and the fourth semiconductor region 14 may be defined as the second direction D2. In such a case, a direction that crosses the second direction D2 may be defined as the first direction D1. For example, the first direction D1 is perpendicular to the stacking direction.

The first insulating film 31 is provided between the second partial region 11b and the first electrode 21 in the second direction D2 (the Z-axis direction). The first insulating film 31 is provided between the second semiconductor region 12 and the first electrode 21 in the first direction D1 (the X-axis direction), between the third semiconductor region 13 and the first electrode 21 in the first direction D1, and between the first electrode 21 and the portion of the fourth semiconductor region 14 recited above in the first direction D1.

For example, the first insulating film 31 contacts the third semiconductor region 13. In the example, the first insulating film 31 contacts the fourth semiconductor region 14. The first insulating film 31 further contacts the second semiconductor region 12.

The first insulating film 31 includes, for example, a bottom portion 31b and a side portion 31s. The bottom portion 31b is provided between the second partial region 11b and the first electrode 21 in the second direction D2 (e.g., the Z-axis direction). The side portion 31s is provided between the second semiconductor region 12 and the first electrode 21 in the first direction D1 (e.g., the X-axis direction), between the third semiconductor region 13 and the first electrode 21 in the first direction D1, and between the first electrode 21 and the portion of the fourth semiconductor region 14 recited above in the first direction D1. The bottom portion 31b is continuous with the side portion 31s.

The fifth semiconductor region 15 is provided between the first insulating film 31 (the bottom portion 31b) and the second partial region 11b in the second direction D2. The fifth semiconductor region 15 is of the second conductivity type (e.g., the p-type).

The sixth semiconductor region 16 is provided between the first insulating film 31 (the bottom portion 31b) and the fifth semiconductor region 15 in the second direction D2. The sixth semiconductor region 16 is of the first conductivity type (e.g., the n-type).

The first to sixth semiconductor regions 11 to 16 include, for example, silicon carbide (SiC). The first semiconductor region 11 functions as, for example, an n-type drift layer. The second semiconductor region 12 functions as, for example, an n-type source region. The third semiconductor region 13 functions as, for example, a p-type base region. The fourth semiconductor region 14 functions as, for example, a current diffusion layer.

The first electrode 21 functions as, for example, a gate electrode. The first insulating film 31 functions as, for example, a gate insulating film.

In the example, the semiconductor device 110 further includes a second electrode 22 and a seventh semiconductor region 17. The second electrode 22 is electrically connected to, for example, the second semiconductor region 12. The seventh semiconductor region 17 is electrically connected to the second electrode 22. The seventh semiconductor region 17 is of the second conductivity type (e.g., the p-type). The second semiconductor region 12 is provided between the seventh semiconductor region 17 and a portion of the first insulating film 31 in the first direction D1 (the X-axis direction). The portion of the first insulating film 31 is a portion of the side portion 31s. For example, a portion of the third semiconductor region 13 is provided between the seventh semiconductor region 17 and the fourth semiconductor region 14 in the second direction D2 (the Z-axis direction). The seventh semiconductor region 17 is connected to the third semiconductor region 13.

The second electrode 22 functions as, for example, a source electrode. The seventh semiconductor region 17 functions as a p-type contact region.

In the example, the semiconductor device 110 further includes a second insulating film 32. The second insulating film 32 is provided between the first electrode 21 and a portion of the second electrode 22. The second insulating film 32 electrically insulates between the first electrode 21 and the second electrode 22.

In the example, the semiconductor device 110 further includes a third electrode 23. The third electrode 23 is electrically connected to the first semiconductor region 11. The first semiconductor region 11 is provided between the third electrode 23 and the fifth semiconductor region 15 and between the third electrode 23 and the fourth semiconductor region 14.

In the example, the semiconductor device 110 further includes an eighth semiconductor region 18. The eighth semiconductor region 18 is provided between the third electrode 23 and the first semiconductor region 11. In the example, the eighth semiconductor region 18 is of the first conductivity type (e.g., the n-type). The eighth semiconductor region 18 is electrically connected to the first semiconductor region 11 and the third electrode 23.

The third electrode 23 is, for example, a drain electrode. The eighth semiconductor region 18 is, for example, a semiconductor substrate.

The seventh semiconductor region 17 and the eighth semiconductor region 18 include, for example, silicon carbide.

For example, the first semiconductor region 11 is provided on the eighth semiconductor region 18 (e.g., a SiC substrate). The fourth semiconductor region 14 is provided on a portion (the first partial region 11a) of the first semiconductor region 11. The third semiconductor region 13 is provided on the fourth semiconductor region 14. The second semiconductor region 12 and the seventh semiconductor region 17 are provided on the third semiconductor region 13. On the other hand, the first electrode 21 (e.g., the gate electrode) is provided on another portion (the second partial region 11b) of the first semiconductor region 11; and the first insulating film 31 is provided around the first electrode 21. The fifth semiconductor region 15 and the sixth semiconductor region 16 are provided between the first insulating film 31 and the second partial region 11b.

As shown in FIG. 1B, for example, the first electrode 21 extends along a third direction D3. The third direction D3 crosses the first direction D1 and the second direction D2. The third direction D3 is, for example, the Y-axis direction.

The first electrode 21 is, for example, an electrode having a trench configuration. For example, a trench is formed in a stacked body including semiconductor regions. The first insulating film 31 is formed at the side wall inside the trench. Then, the first electrode 21 is formed by filling a conductive material into the remaining space of the trench.

The semiconductor device 110 includes, for example, a gate electrode having a trench configuration and is a MOSFET (metal-oxide-semiconductor field-effect transistor)-type SiC transistor.

In the example, the fifth semiconductor region 15 extends along the first electrode 21. The fifth semiconductor region 15 extends along the third direction D3. The sixth semiconductor region 16 extends along the first electrode 21. The sixth semiconductor region 16 also extends along the third direction D3.

The impurity of the first conductivity type includes a Group III element in the case where the semiconductor regions provided in the semiconductor device 110 include SiC and the first conductivity type is the n-type. In such a case, the impurity of the second conductivity type (the p-type) includes a Group V element. The Group III element that is used as the impurity includes, for example, at least one selected from the group consisting of Al and B. The Group V element that is used as the impurity includes, for example, at least one selected from the group consisting of N, P, and As.

For example, the fifth semiconductor region 15 weakens the electric field applied to the first insulating film 31. Thereby, damage that occurs in the first insulating film 31 can be suppressed. For example, an electric field relaxation structure can be formed of the fifth semiconductor region 15.

In the embodiment, an impurity concentration (a first impurity concentration) of the first conductivity type (e.g., the n-type) in the sixth semiconductor region 16 is higher than an impurity concentration (a second impurity concentration) of the first conductivity type in the fourth semiconductor region 14.

Thereby, the damage that occurs in the first insulating film 31 when avalanche breakdown occurs can be suppressed. For example, the degradation of the first insulating film 31 can be suppressed. For example, the breakdown of the first insulating film 31 can be suppressed.

As recited above, by providing the fifth semiconductor region 15, for example, a p-base electric field relaxation structure of the trench bottom can be formed. Thereby, for example, it is considered that the maximum value of the electric field generated in the gate insulating film when OFF can be suppressed. However, if only such an electric field relaxation structure is provided, the suppression of the degradation of the gate insulating film after the avalanche breakdown occurs is insufficient.

For example, hot holes flow into the gate insulating film when the avalanche breakdown occurs. Thereby, there are cases where the gate insulating film degrades.

In the embodiment, the sixth semiconductor region 16 (e.g., of the n-type) is provided between the fifth semiconductor region 15 (e.g., of the p-type) and the first insulating film 31. Thereby, the energy barrier height between the fifth semiconductor region 15 and the first insulating film 31 can be large. Thereby, even when the avalanche breakdown occurs and the hot holes are generated, the inflow of the hot holes into the first insulating film 31 can be suppressed. Thereby, the degradation of the first insulating film 31 can be suppressed. The breakdown of the first insulating film 31 can be suppressed.

In the embodiment, the degradation of the first insulating film 31 due to the avalanche breakdown can be suppressed substantially without causing the maximum electric field applied to the first insulating film 31 to degrade. Thereby, a semiconductor device can be provided in which the reliability can be increased.

An example of characteristics of semiconductor devices will now be described.

Figure 2A:
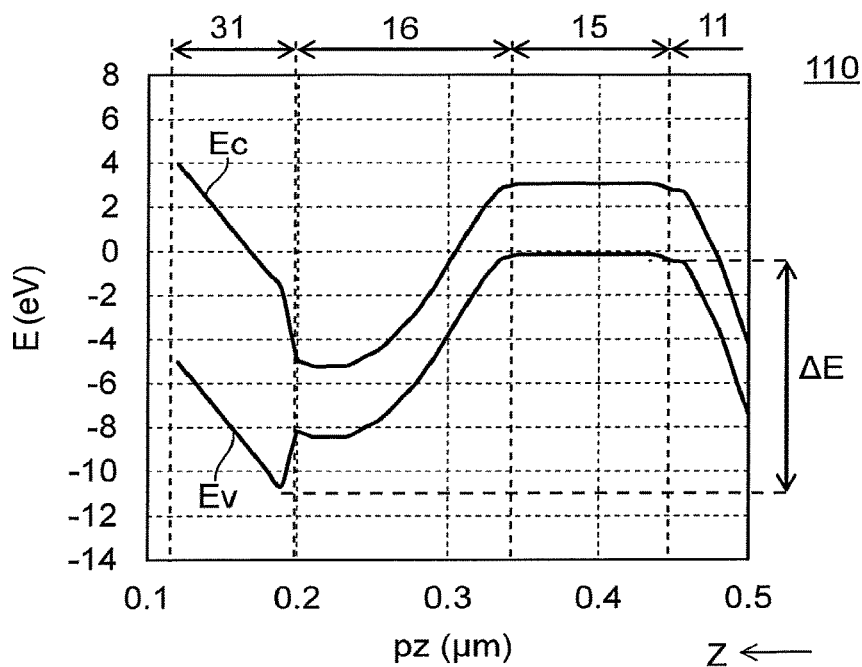
FIG. 2A and FIG. 2B are graphs illustrating the characteristics of the semiconductor devices.
Figure 2B:
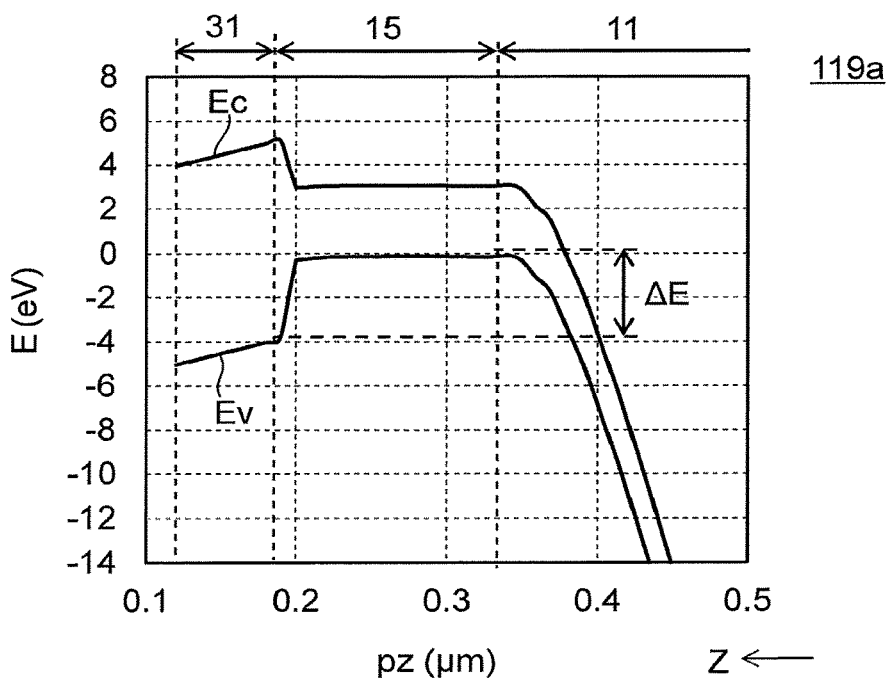

FIG. 2A and FIG. 2B are graphs illustrating the characteristics of the semiconductor devices.

These figures show an example of simulation results of the characteristics of the semiconductor devices. FIG. 2A corresponds to the semiconductor device 110 according to the embodiment. FIG. 2B corresponds to a semiconductor device 119a of a first reference example. In these figures, the horizontal axis is a position pz (μm) along the Z-axis direction. In these figures, the vertical axis is the energy E (eV). An energy Ev of the valence band and an energy Ec of the conduction band are illustrated in these figures. In these figures, the n-type impurity concentration (a first impurity concentration C1) of the sixth semiconductor region 16 is $8 \times 10^{17}/cm^3$. On the other hand, the n-type impurity concentration (the second impurity concentration) of the fourth semiconductor region 14 is $8 \times 10^{15}/cm^3$. As shown in FIG. 2B, the sixth semiconductor region 16 is not provided in the semiconductor device 119a of the first reference example. The first insulating film 31 contacts the fifth semiconductor region 15. An energy barrier height ΔE between the first insulating film 31 and the fifth semiconductor region 15 is relatively small. The absolute value of the energy barrier height ΔE is about 4 eV.

It is considered that in the semiconductor device 119a, for example, the hot holes can flow into the first insulating film 31 from the fifth semiconductor region 15 relatively easily.

Conversely, as shown in FIG. 2A, the sixth semiconductor region 16 is provided between the first insulating film 31 and the fifth semiconductor region 15 in the semiconductor device 110 according to the embodiment. The absolute value of the energy barrier height ΔE in the semiconductor device 110 is, for example, about 12 eV. The energy barrier height ΔE in the semiconductor device 110 is larger than the energy barrier height ΔE in the semiconductor device 119a.

Thereby, in the semiconductor device 110, it is difficult for the hot holes to flow into the first insulating film 31 from the fifth semiconductor region 15.

Thus, in the embodiment, for example, even in the case where hot holes are generated by avalanche breakdown, etc., the inflow of the hot holes into the first insulating film 31 can be suppressed. Thereby, the degradation (also including breakdown) of the first insulating film 31 can be suppressed. Thereby, high reliability is obtained.

Examples of concentrations of the impurity in the sixth semiconductor region 16 will now be described.

Figure 3A:
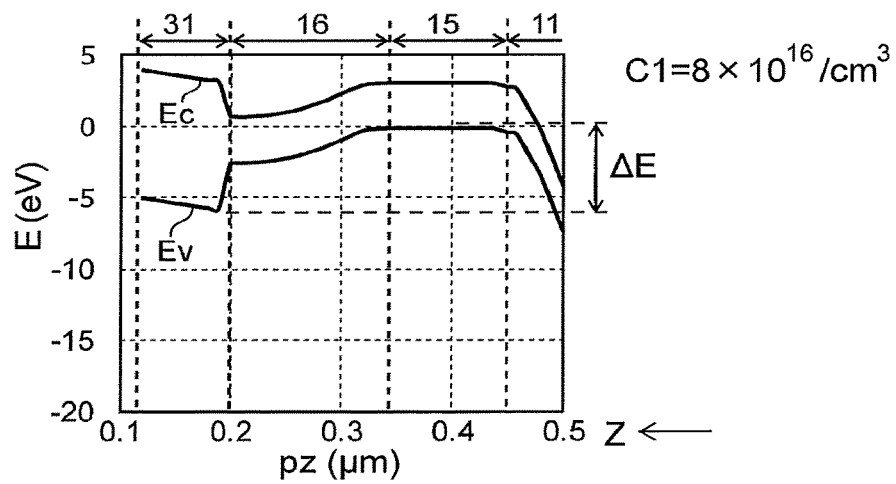
FIG. 3A to FIG. 3C are graphs illustrating the characteristics of the semiconductor device.
Figure 3B:
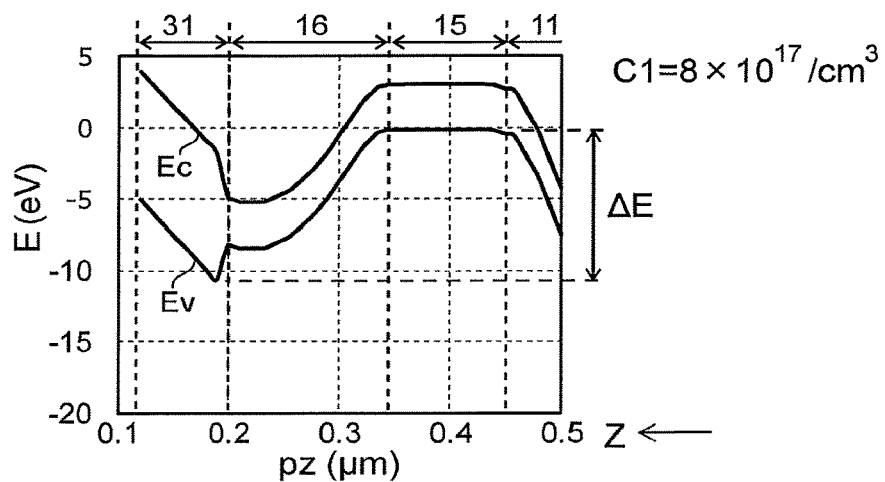
Figure 3C:
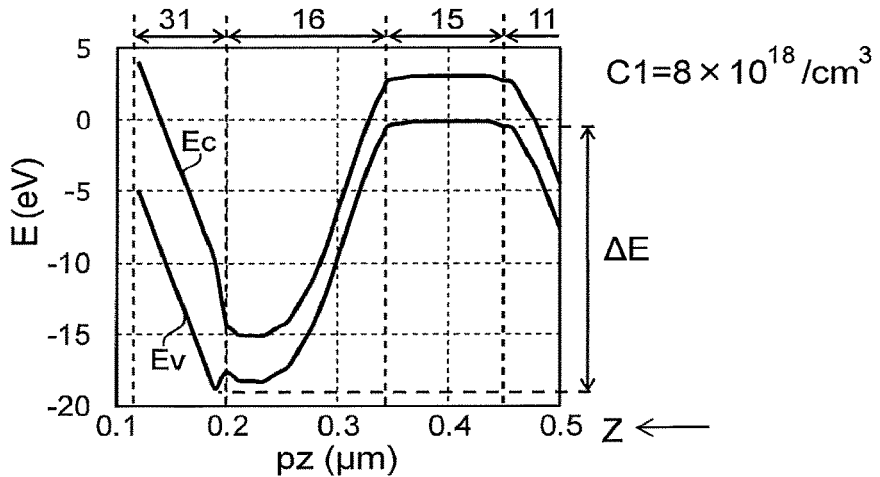

FIG. 3A to FIG. 3C are graphs illustrating the characteristics of the semiconductor device.

These figures show an example of simulation results of the characteristics of the semiconductor device including the fifth semiconductor region 15 and the sixth semiconductor region 16. The horizontal axis is the position pz (μm) along the Z-axis direction. The vertical axis is the energy E (eV). In these figures, the n-type impurity concentrations (the first impurity concentrations C1) in the sixth semiconductor region 16 are different from each other. In FIG. 3A, the first impurity concentration C1 is $8\times10^{16}/cm^3$. In FIG. 3B, the first impurity concentration C1 is $8\times10^{17}/cm^3$. In FIG. 3C, the first impurity concentration C1 is $8\times10^{18}/cm^3$. In these figures, the n-type impurity concentration (the second impurity concentration) in the fourth semiconductor region 14 is $8\times10^{15}/cm^3$.

As shown in FIG. 3A, the energy barrier height ΔE is about 6 eV in the case where the first impurity concentration C1 is $8\times10^{16}/cm^3$. As shown in FIG. 3B, the energy barrier height ΔE is about 12 eV in the case where the first impurity concentration C1 is $8\times10^{17}/cm^3$. As shown in FIG. 3C, the energy barrier height ΔE is about 18 eV in the case where the first impurity concentration C1 is $8\times10^{18}/cm^3$.

Thus, the energy barrier height ΔE increases as the first impurity concentration C1 increases.

Figure 4A:
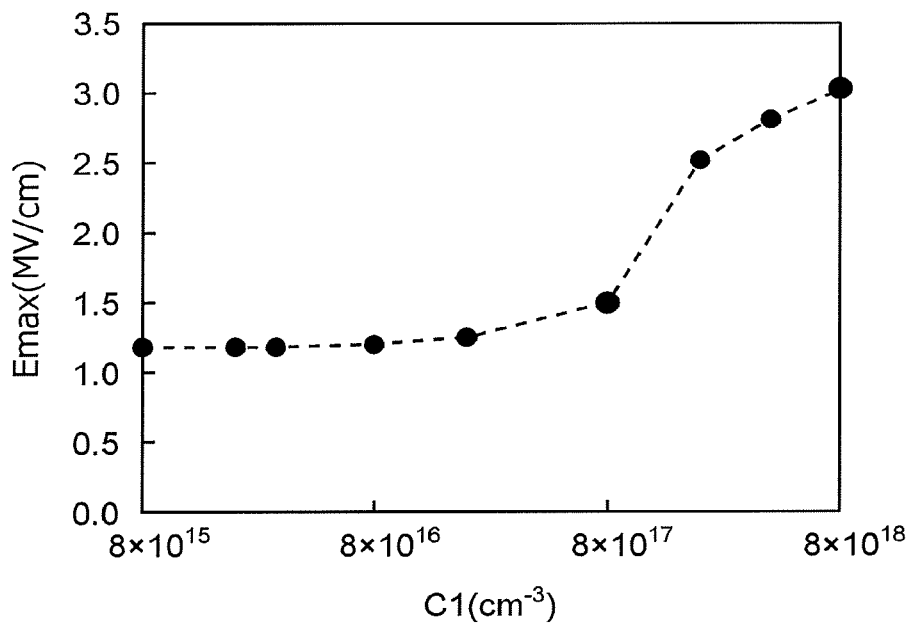
FIG. 4A and FIG. 4B are graphs illustrating characteristics of the semiconductor device.
Figure 4B:
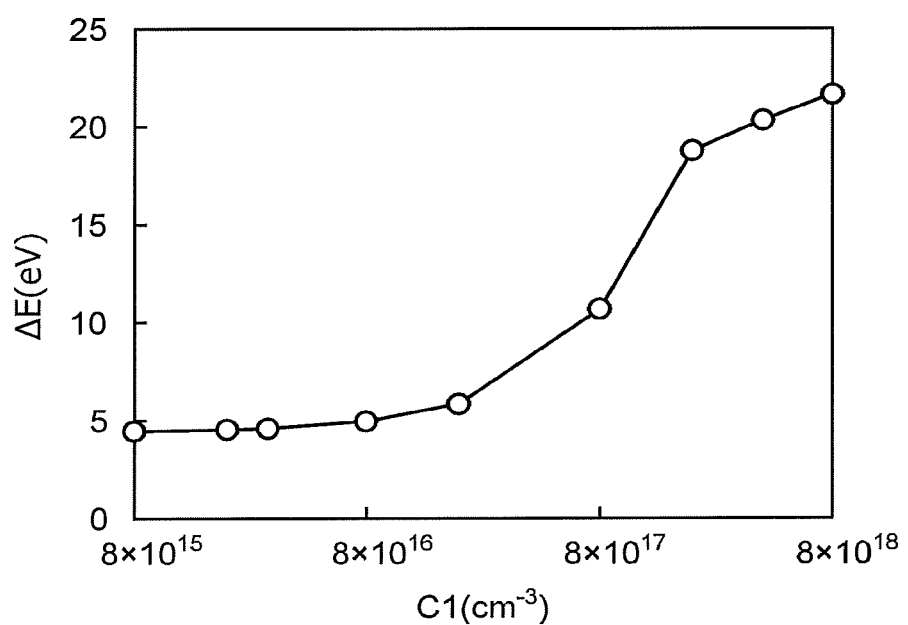

FIG. 4A and FIG. 4B are graphs illustrating characteristics of the semiconductor device.

These figures illustrate the characteristics of the semiconductor device including the fifth semiconductor region 15 and the sixth semiconductor region 16. In these figures, the horizontal axis is the n-type impurity concentration (the first impurity concentration C1) of the sixth semiconductor region 16. The vertical axis of FIG. 4A is a maximum electric field Emax (MV/cm) applied to the gate insulating film (e.g., the first insulating film 31) when a reverse voltage is applied. The maximum electric field Emax shown in FIG. 4A is for a reverse voltage of 1200 V applied in a 1.2 kV-class element. The vertical axis of FIG. 4B is the energy barrier height ΔE (eV).

As shown in FIG. 4B, the energy barrier height ΔE starts to increase when the first impurity concentration C1 exceeds $8\times10^{16}/cm^3$. For example, the energy barrier height ΔE when the first impurity concentration C1 is $8\times10^{17}/cm^3$ is about 2 times the energy barrier height ΔE when the first impurity concentration C1 is less than $8\times10^{16}/cm^3$.

On the other hand, as shown in FIG. 4A, the maximum electric field Emax increases when the first impurity concentration C1 is increased. The maximum electric field Emax reaches 3 MV/cm when the first impurity concentration C1 is excessively high, e.g., about $8\times10^{18}/cm^3$. Therefore, if the first impurity concentration C1 exceeds $8\times10^{18}/cm^3$, the reliability of the first insulating film 31 decreases when the reverse voltage is applied for a long period of time.

In the embodiment, it is favorable for the first impurity concentration C1 to be not less than $8\times10^{16}/cm^3$ and not more than $8\times10^{18}/cm^3$. The energy barrier height ΔE can be increased by setting the first impurity concentration C1 to be $8\times10^{16}/cm^3$ or more. By setting the first impurity concentration C1 to be $8\times10^{18}/cm^3$ or less, for example, the maximum electric field Emax is not excessively large; and high reliability is obtained.

For example, when the first impurity concentration C1 exceeds $2\times10^{18}/cm^3$, there are cases where, for example, the breakdown voltage of the first insulating film 31 decreases. For example, when the first impurity concentration C1 exceeds $8\times10^{18}/cm^3$, the reliability of the first insulating film 31 decreases easily. By setting the first impurity concentration C1 to be $2\times10^{18}/cm^3$ or less, the decrease of the breakdown voltage can be suppressed.

For example, it is favorable for the first impurity concentration C1 to be not less than 1.2 times and not more than 40 times the second impurity concentration (the impurity concentration of the first conductivity type in the fourth semiconductor region 14). By setting the first impurity concentration C1 to be not less than 1.2 times the second impurity concentration, for example, the energy barrier height ΔE can be increased substantially without increasing the electric field applied to the first insulating film 31. By setting the first impurity concentration C1 to be not more than 40 times the second impurity concentration, for example, the energy barrier height ΔE can be increased drastically while suppressing the electric field applied to the first insulating film 31 to be 3 MV/cm or less.

The sixth semiconductor region 16 includes, for example, an impurity of the first conductivity type and an impurity of the second conductivity type. The fourth semiconductor region 14 includes an impurity of the first conductivity type. The fourth semiconductor region 14 may further include an impurity of the second conductivity type.

The impurity concentration of the second conductivity type in the sixth semiconductor region 16 is taken as a third impurity concentration. The first impurity concentration is higher than the third impurity concentration.

The impurity concentration of the second conductivity type in the fourth semiconductor region 14 is taken as a fourth impurity concentration. The fourth impurity concentration may be the detection limit or less. In such a case, the fourth impurity concentration is taken to be $1\times10^{15}/cm^3$ for convenience. The second impurity concentration is higher than the fourth impurity concentration.

In the sixth semiconductor region 16, the difference between the product of the impurity concentration and the activation rate of the first conductivity type and the product of the impurity concentration and the activation rate of the second conductivity type corresponds to the effective carrier concentration. For example, the difference between the product of the first impurity concentration C1 and the activation rate and the product of the third impurity concentration and the activation rate corresponds to the effective carrier concentration of the sixth semiconductor region 16.

In the fourth semiconductor region 14, the difference between the product of the impurity concentration and the activation rate of the first conductivity type and the product of the impurity concentration and the activation rate of the second conductivity type corresponds to the effective carrier concentration. For example, the difference between the product of the second impurity concentration and the activation rate and the product of the fourth impurity concentration and the activation rate corresponds to the effective carrier concentration of the fourth semiconductor region 14.

The difference between the first impurity concentration C1 and the third impurity concentration (the third impurity concentration of the second conductivity type in the sixth semiconductor region 16) is taken as a first difference. The difference between the second impurity concentration and the fourth impurity concentration (the fourth impurity concentration of the second conductivity type in the fourth semiconductor region 14) is taken as a second difference. For example, the first difference is larger than the second difference.

For example, the first difference is not less than 1.2 times and not more than 40 times the second difference. By setting the first difference to be not less than 1.2 times the second difference, for example, the energy barrier height ΔE can be increased substantially without increasing the electric field applied to the first insulating film 31. By setting the first difference to be not more than 40 times the second difference, for example, the energy barrier height ΔE can be increased drastically while suppressing the electric field applied to the first insulating film 31 to be 3 MV/cm or less.

On the other hand, the impurity concentration of the first conductivity type in the second semiconductor region 12 (the source region) is higher than the impurity concentration (the first impurity concentration C1) of the first conductivity type in the sixth semiconductor region 16. In other words, the first impurity concentration C1 is lower than the impurity concentration of the first conductivity type in the second semiconductor region 12.

For example, the impurity concentration of the first conductivity type in the second semiconductor region 12 is taken as a fifth impurity concentration. The impurity concentration of the second conductivity type in the second semiconductor region 12 is taken as a sixth impurity concentration. The sixth impurity concentration may be the detection limit or less. In such a case, the sixth impurity concentration is taken to be $1 \times 10^{15}/cm^3$ for convenience. The fifth impurity concentration is higher than the sixth impurity concentration. The difference between the fifth impurity concentration (the impurity concentration of the first conductivity type in the second semiconductor region 12) and the sixth impurity concentration (the impurity concentration of the second conductivity type in the second semiconductor region 12) is taken as a third difference. For example, the first difference is smaller than the third difference.

By setting the impurity concentration of the second semiconductor region 12 (the source region) to be high, a good electrical connection is obtained between the second semiconductor region 12 and the second electrode 22.

For example, in the embodiment, the n-type impurity concentration (the first impurity concentration C1) in the sixth semiconductor region 16 may be, for example, not less than $8 \times 10^{16}/cm^3$ and not more than $4 \times 10^{18}/cm^3$. The p-type impurity concentration (the third impurity concentration) in the sixth semiconductor region 16 is, for example, not less than $1 \times 10^{13}/cm^3$ and not more than $2 \times 10^{18}/cm^3$.

For example, the n-type impurity concentration (the second impurity concentration) in the fourth semiconductor region 14 is, for example, not less than $8 \times 10^{15}/cm^3$ and not more than $4 \times 10^{17}/cm^3$. The p-type impurity concentration (the fourth impurity concentration) in the fourth semiconductor region 14 is, for example, not less than $1 \times 10^{13}/cm^3$ and not more than $3 \times 10^{17}/cm^3$.

For example, the n-type impurity concentration (the fifth impurity concentration) in the second semiconductor region 12 is, for example, not less than $1 \times 10^{18}/cm^3$ and not more than $1 \times 10^{21}/cm^3$. The p-type impurity concentration (the sixth impurity concentration) in the second semiconductor region 12 is, for example, not less than $1 \times 10^{13}/cm^3$ and not more than $1 \times 10^{18}/cm^3$.

For example, the n-type impurity concentration in the first semiconductor region 11 is, for example, not less than $1 \times 10^{15}/cm^3$ and not more than $1 \times 10^{17}/cm^3$. The p-type impurity concentration in the first semiconductor region 11 is, for example, not less than $1 \times 10^{13}/cm^3$ and not more than $1 \times 10^{16}/cm^3$.

For example, the n-type impurity concentration in the third semiconductor region 13 is, for example, not less than $1 \times 10^{15}/cm^3$ and not more than $4 \times 10^{17}/cm^3$. The p-type impurity concentration in the third semiconductor region 13 is, for example, not less than $1 \times 10^{15}/cm^3$ and not more than $1 \times 10^{18}/cm^3$.

For example, the n-type impurity concentration in the fifth semiconductor region 15 is, for example, not less than $1 \times 10^{15}/cm^3$ and not more than $4 \times 10^{17}/cm^3$. The p-type impurity concentration in the fifth semiconductor region 15 is, for example, not less than $1 \times 10^{18}/cm^3$ and not more than $1 \times 10^{21}/cm^3$.

For example, the n-type impurity concentration in the seventh semiconductor region 17 is, for example, not less than $1 \times 10^{15}/cm^3$ and not more than $4 \times 10^{17}/cm^3$. The p-type impurity concentration in the seventh semiconductor region 17 is, for example, not less than $1 \times 10^{18}/cm^3$ and not more than $1 \times 10^{21}/cm^3$.

For example, a thickness t6 of the sixth semiconductor region 16 (referring to FIG. 1A) is, for example, not less than 50 nm and not more than 300 nm. The thickness t6 is the thickness along the second direction D2 (the Z-axis direction) of the sixth semiconductor region 16.

For example, a thickness t5 of the fifth semiconductor region 15 (referring to FIG. 1A) is, for example, not less than 200 nm and not more than 500 nm. The thickness t5 is the thickness along the second direction D2 (the Z-axis direction) of the fifth semiconductor region 15. For example, the thickness t5 is not less than 0.5 times and not more than 10 times the thickness t6.

For example, a lower end 15b of the fifth semiconductor region 15 may be positioned lower than a lower end 14b of the fourth semiconductor region 14. For example, at least a portion of the fifth semiconductor region 15 overlaps a portion of the first semiconductor region 11 in the first direction D1 (e.g., the X-axis direction). The n-type impurity concentration in the first semiconductor region 11 is lower than the n-type impurity concentration in the fourth semiconductor region 14. By positioning the lower end 15b of the fifth semiconductor region 15 to be lower than the lower end 14b of the fourth semiconductor region 14, for example, the breakdown voltage increases because the electric field concentration when the reverse voltage is applied is relaxed.

Figure 5:
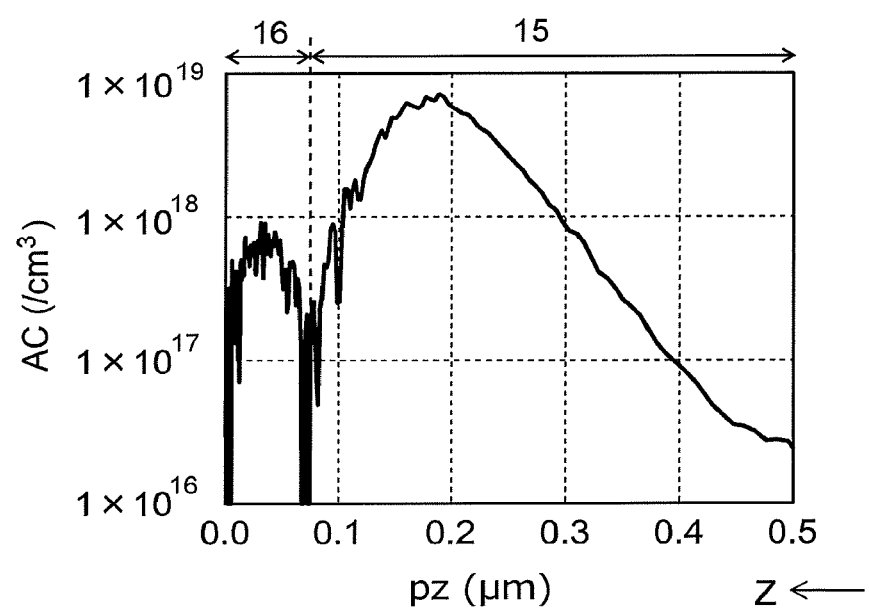
FIG. 5 is a graph illustrating a characteristic of the semiconductor device according to the embodiment.

FIG. 5 is a graph illustrating a characteristic of the semiconductor device according to the embodiment.

FIG. 5 shows an example of measurement results of the impurities in the sixth semiconductor region 16 and the fifth semiconductor region 15 of the semiconductor device 110 according to the embodiment. The horizontal axis is the position pz (μm) along the Z-axis direction. The vertical axis is an absolute value AC (/cm$^3$) of the impurity concentration. The absolute value AC of the impurity concentration is the difference between the impurity concentration of the first conductivity type and the impurity concentration of the second conductivity type. In the sixth semiconductor region 16, the impurity concentration of the first conductivity type is higher than the impurity concentration of the second conductivity type. In the sixth semiconductor region 16, the absolute value AC of the impurity concentration is ("the impurity concentration of the first conductivity type" minus "the impurity concentration of the second conductivity type"). In the fifth semiconductor region 15, the impurity concentration of the second conductivity type is higher than the impurity concentration of the first conductivity type. In the fifth semiconductor region 15, the absolute value AC of the impurity concentration is ("the impurity concentration of the second conductivity type" minus "the impurity concentration of the first conductivity type").

In one example as shown in FIG. 5, the absolute value AC of the impurity concentration in the sixth semiconductor region 16 is, for example, not less than $5 \times 10^{17}$/cm$^3$ and not more than $9 \times 10^{17}$ cm$^3$. In the one example, the maximum value of the absolute value AC of the impurity concentration in the fifth semiconductor region 15 is about $8 \times 10^{18}$ cm$^3$.

FIG. 5 is one example; and various modifications of the values and distributions of the impurity concentrations are possible in the embodiment.

In the embodiment, the first electrode 21 includes, for example, polysilicon. The first electrode 21 includes a metal. The metal includes, for example, at least one selected from the group consisting of Al, Au, and Ag. At least one of the second electrode 22 or the third electrode 23 includes, for example, a metal (e.g., at least one selected from the group consisting of Ni, Ti, Al, Au, and Ag, etc.).

At least one of the first insulating film 31 or the second insulating film 32 includes at least one of silicon oxide, silicon nitride, silicon oxynitride, or aluminum oxide.

The description recited above relating to the materials is an example; and other materials may be used as these electrodes and insulating films in the embodiment.

There is a second reference example having a double trench structure in which the source electrode, in addition to the gate electrode, also has a trench configuration. In the second reference example, the position where the avalanche breakdown occurs is separated from the gate insulating film. Therefore, the degradation of the gate insulating film does not occur easily when the avalanche breakdown occurs. However, in the second reference example, it is difficult to reduce the cell pitch due to the double trench structure. Therefore, for example, it is difficult to reduce the ON resistance.

Conversely, the cell pitch can be small in the semiconductor device 110 according to the embodiment. Therefore, the degradation of the gate insulating film when the avalanche breakdown occurs can be suppressed while maintaining a low ON resistance.

An example of a method for manufacturing the semiconductor device 110 will now be described.

FIG. 6A to FIG. 6E are schematic cross-sectional views in order of the processes, illustrating the method for manufacturing the semiconductor device according to the embodiment.

A stacked body SB is prepared as shown in FIG. 6A. The stacked body SB includes, for example, first to fourth semiconductor films 11F to 14F. The first semiconductor film 11F is provided on a substrate 18s and is of the first conductivity type. The fourth semiconductor film 14F is provided on the first semiconductor film 11F and is of the first conductivity type. The third semiconductor film 13F is provided on the fourth semiconductor film 14F and is of the second conductivity type. The second semiconductor film 12F is provided on the third semiconductor film 13F and is of the first conductivity type. The seventh semiconductor region 17 is provided in the example. These semiconductor films and the seventh semiconductor region 17 are, for example, SiC films.

A trench T1 is formed in such a stacked body SB from the surface of the second semiconductor film 12F. The trench T1 reaches a portion of the fourth semiconductor film 14F from the second semiconductor film 12F. For example, etching (e.g., RIE or the like) using a mask having an opening is used to form the trench T1.

As shown in FIG. 6B, a first insulating portion Ip1 is formed at the side wall of the trench T1. At least a portion of the bottom portion of the trench T1 is not covered with the first insulating portion Ip1. For example, a silicon oxide film is formed as the first insulating portion Ip1.

As shown in FIG. 6C, an impurity I2 of the second conductivity type is introduced to at least a portion of the bottom portion of the trench T1. For example, Al is implanted as the impurity I2 of the second conductivity type. As described below, a portion of the region where the impurity I2 is introduced becomes the fifth semiconductor region 15.

An impurity I1 of the first conductivity type is introduced as shown in FIG. 6D. The impurity I1 is introduced to the upper portion of a portion of the at least a portion of the bottom portion of the trench T1 where the impurity I2 of the second conductivity type is introduced. The region where the impurity I1 is introduced becomes the sixth semiconductor region 16. The region where the impurity I1 is substantially not introduced becomes the fifth semiconductor region 15.

The fifth semiconductor region 15 includes the impurity of the first conductivity type included in the first semiconductor region 11 and the implanted impurity I2 of the second conductivity type. The sixth semiconductor region 16 includes the impurity of the first conductivity type included in the first semiconductor region 11, the implanted impurity I2 of the second conductivity type, and the implanted impurity I1 of the first conductivity type.

Thus, the fifth semiconductor region 15 and the sixth semiconductor region 16 that are formed by this method include the impurity of the first conductivity type and the impurity of the second conductivity type. For example, the fifth semiconductor region 15 and the sixth semiconductor region 16 include a Group III element and a Group V element.

The concentration of the impurity of the first conductivity type in the sixth semiconductor region 16 (the upper portion recited above where the impurity I1 of the first conductivity type is introduced) is higher than the concentration of the impurity of the second conductivity type in the sixth semiconductor region 16 (the upper portion recited above where the impurity I1 of the first conductivity type is introduced). The sixth semiconductor region 16 is of the first conductivity type.

As shown in FIG. 6E, a second insulating portion Ip2 is formed on the upper portion recited above where the impurity I1 of the first conductivity type is introduced. The first electrode 21 is formed by introducing a conductive material into the remaining space of the trench T1 on the second insulating portion Ip2.

Further, the second insulating film 32, the second electrode 22, the third electrode 23, etc., are formed. Thereby, the semiconductor device 110 can be made.

According to the manufacturing method, a method for manufacturing a semiconductor device can be provided in which the reliability can be increased.

Another example of the method for manufacturing the semiconductor device 110 will now be described.

FIG. 7A to FIG. 7D are schematic cross-sectional views in order of the processes, illustrating the other method for manufacturing the semiconductor device according to the embodiment.

Figure 7A:
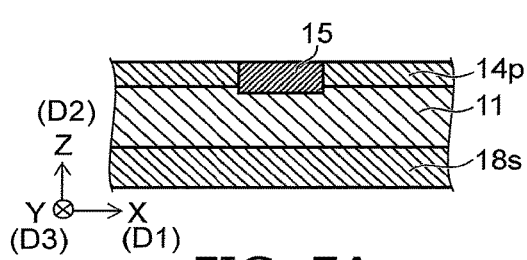
FIG. 7A to FIG. 7D are schematic cross-sectional views in order of the processes, illustrating the other method for manufacturing the semiconductor device according to the embodiment.

As shown in FIG. 7A, the fifth semiconductor region 15 and a portion 14p of the fourth semiconductor region 14 are formed on the first semiconductor region 11 provided on the substrate 18s. These semiconductor regions may be formed by, for example, epitaxial growth.

Figure 7B:
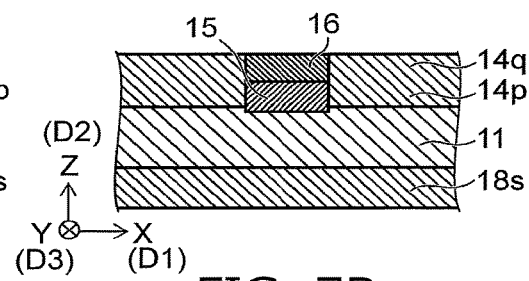

As shown in FIG. 7B, the sixth semiconductor region 16 and another portion 14q of the fourth semiconductor region 14 are further formed on the portion 14p and the fifth semiconductor region 15. These semiconductor regions may be formed by, for example, epitaxial growth.

Figure 7C:
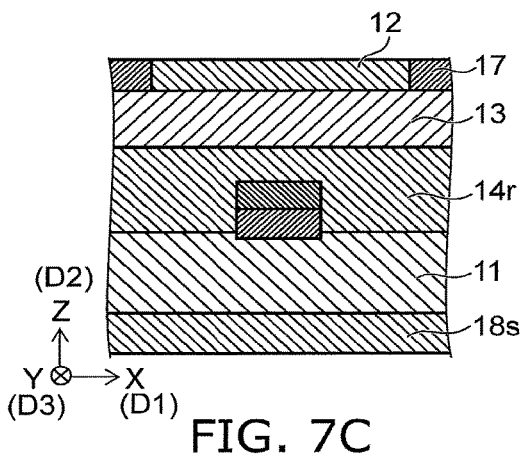

As shown in FIG. 7C, the seventh semiconductor region 17, the second semiconductor region 12, the third semiconductor region 13, and yet another portion 14r of the fourth semiconductor region 14 are formed on the portion 14q and the sixth semiconductor region 16. These semiconductor regions may be formed by, for example, epitaxial growth.

Figure 7D:
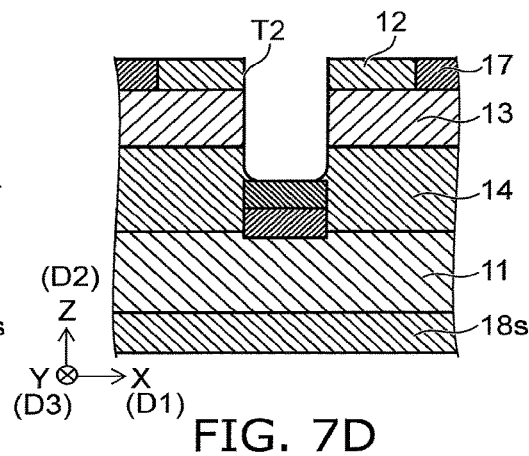

As shown in FIG. 7D, a trench T2 that pierces the second semiconductor region 12, the third semiconductor region 13, and a portion of the fourth semiconductor region 14 and reaches the sixth semiconductor region 16 is formed.

Subsequently, the first insulating film 31, the first electrode 21, the second insulating film 32, the second electrode 22, the third electrode 23, etc., are formed. Thereby, the semiconductor device 110 can be made.

In the method for manufacturing as well, a method for manufacturing a semiconductor device can be provided in which the reliability can be increased.

Second Embodiment

Figure 8A:
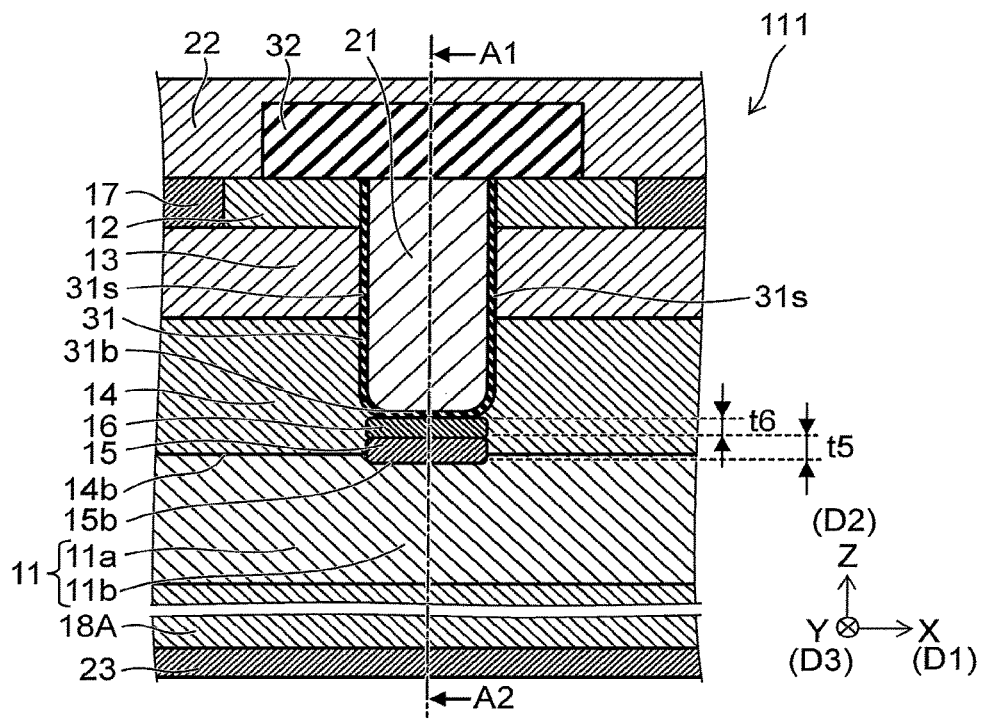
FIG. 8A and FIG. 8B are schematic views illustrating a semiconductor device according to a second embodiment.
Figure 8B:
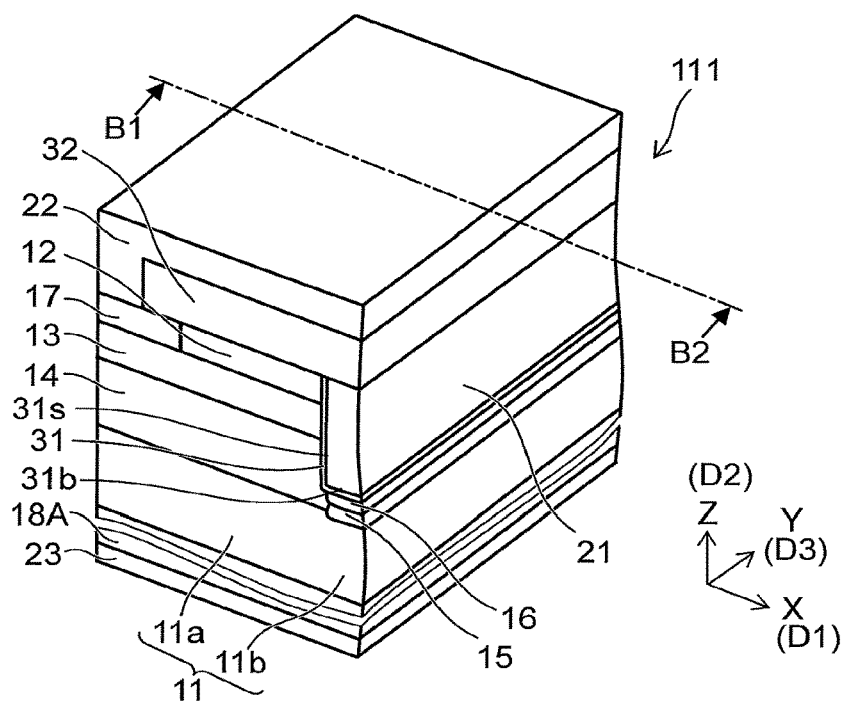

FIG. 8A and FIG. 8B are schematic views illustrating a semiconductor device according to a second embodiment.

FIG. 8A is a cross-sectional view corresponding to a cross section along line B1-B2 shown in FIG. 8B. FIG. 8B is a perspective view when cut by line A1-A2 of FIG. 8A.

As shown in these drawings, the first to seventh semiconductor regions 11 to 17, the first to third electrodes 21 to 23, the first insulating film 31, and the second insulating film 32 are provided in the semiconductor device 111 according to the embodiment as well. These components are similar to those of the semiconductor device 110. An eighth semiconductor region 18A is provided in the semiconductor device 111 as well. The eighth semiconductor region 18A is of the second conductivity type (e.g., the p-type).

Thus, the third electrode 23 and the eighth semiconductor region 18A are provided in the semiconductor device 111. The eighth semiconductor region 18A is provided between the third electrode 23 and the first semiconductor region 11. The eighth semiconductor region 18A is electrically connected to the third electrode 23. The eighth semiconductor region 18A is of the second conductivity type.

The semiconductor device 111 is, for example, an IGBT (Insulated Gate Bipolar Transistor). In the semiconductor device 111 as well, a semiconductor device can be provided in which the reliability can be increased.

For example, the semiconductor device 111 can be manufactured by appropriately modifying the manufacturing method described in the first embodiment.

According to the embodiment, a semiconductor device and a method for manufacturing the semiconductor device can be provided in which the reliability can be increased.

In the embodiment, the information that relates to the impurity concentration is obtained by, for example, SIMS (Secondary Ion Mass Spectrometry), etc. In the description recited above, the impurity concentration may be, for example, the carrier concentration obtained by SCM (Scanning Capacitance Microscopy), etc.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor region including a first partial region and a second partial region and being of a first conductivity type;
a second semiconductor region separated from the first partial region in a second direction crossing a first direction, the second semiconductor region being of the first conductivity type, the first direction being from the first partial region toward the second partial region;
a third semiconductor region provided between the first partial region and the second semiconductor region, the third semiconductor region being of a second conductivity type;
a fourth semiconductor region provided between the first partial region and the third semiconductor region, the fourth semiconductor region being of the first conductivity type;
a first electrode separated from the second partial region in the second direction and separated from the second semiconductor region, the third semiconductor region, and a portion of the fourth semiconductor region in the first direction;
a first insulating film contacting the third semiconductor region and being provided between the second partial region and the first electrode in the second direction, between the second semiconductor region and the first electrode in the first direction, between the third semiconductor region and the first electrode in the first direction, and between the first electrode and the portion of the fourth semiconductor region in the first direction;
a fifth semiconductor region provided between the first insulating film and the second partial region in the second direction, the fifth semiconductor region being of the second conductivity type; and
a sixth semiconductor region provided between the first insulating film and the fifth semiconductor region in the second direction, the sixth semiconductor region being of the first conductivity type,
a first impurity concentration of the first conductivity type in the sixth semiconductor region being higher than a second impurity concentration of the first conductivity type in the fourth semiconductor region.

2. The device according to claim 1, wherein the first impurity concentration is not less than 1.2 times and not more than 40 times the second impurity concentration.

3. The device according to claim 1, wherein a first difference between the first impurity concentration and a third impurity concentration of the second conductivity type in the sixth semiconductor region is larger than a second difference between the second impurity concentration and a fourth impurity concentration of the second conductivity type in the fourth semiconductor region.

4. The device according to claim 1, wherein the first impurity concentration is not less than $8\times10^{16}/cm^3$ and not more than $8\times10^{18}/cm^3$.

5. The device according to claim 1, wherein the first impurity concentration is lower than an impurity concentration of the first conductivity type in the second semiconductor region.

6. The device according to claim 1, wherein at least a portion of the fifth semiconductor region overlaps a portion of the first semiconductor region in the first direction.

7. The device according to claim 1, wherein
the first to sixth semiconductor regions include silicon carbide,
the fifth semiconductor region further includes a Group III element and a Group V element, and
the sixth semiconductor region further includes the Group III element and the Group V element.

8. The device according to claim 3, wherein the first difference is not less than 1.2 times and not more than 40 times the second difference.

9. The device according to claim 3, wherein the first difference is smaller than a third difference between a fifth impurity concentration of the first conductivity type in the second semiconductor region and a sixth impurity concentration of the second conductivity type in the second semiconductor region.

10. The device according to claim 1, wherein a thickness along the second direction of the sixth semiconductor region is not less than 30 nm and not more than 300 nm.

11. The device according to claim 1, wherein the first insulating film contacts the fourth semiconductor region.

12. The device according to claim 1, wherein the first insulating film contacts the second semiconductor region.

13. The device according to claim 1, wherein
the first electrode extends along a third direction crossing the first direction and the second direction, and
the fifth semiconductor region extends along the third direction.

14. The device according to claim 13, wherein the sixth semiconductor region extends along the third direction.

15. The device according to claim 1, further comprising a second electrode electrically connected to the second semiconductor region.

16. The device according to claim 15, further comprising a seventh semiconductor region electrically connected to the second electrode, the seventh semiconductor region being of the second conductivity type,
the second semiconductor region being provided between the seventh semiconductor region and a portion of the first insulating film in the first direction,
a portion of the third semiconductor region being provided between the seventh semiconductor region and the fourth semiconductor region in the second direction.

17. The device according to claim 1, further comprising a third electrode electrically connected to the first semiconductor region,
the first semiconductor region being provided between the third electrode and the fifth semiconductor region and between the third electrode and the fourth semiconductor region.

18. The device according to claim 16, further comprising an eighth semiconductor region provided between the third electrode and the first semiconductor region, the eighth semiconductor region being of the first conductivity type,
the eighth semiconductor region being electrically connected to the first semiconductor region and the third electrode.

19. The device according to claim 1, further comprising:
a third electrode; and
an eighth semiconductor region provided between the third electrode and the first semiconductor region and electrically connected to the third electrode, the eighth semiconductor region being of the second conductivity type.

* * * * *